United States Patent
Park et al.

(10) Patent No.: US 9,305,899 B2
(45) Date of Patent: Apr. 5, 2016

(54) METHOD OF FABRICATING SEMICONDUCTOR PACKAGE

(71) Applicant: Samsung Electronics Co., Ltd., Suwon-si, Gyeonggi-do (KR)

(72) Inventors: Jae-Yong Park, Cheonan-si (KR); Jun-Young Ko, Cheonan-si (KR); Sang-Jun Kim, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/640,464

(22) Filed: Mar. 6, 2015

(65) Prior Publication Data
US 2015/0179625 A1    Jun. 25, 2015

Related U.S. Application Data

(62) Division of application No. 13/837,179, filed on Mar. 15, 2013, now abandoned.

(30) Foreign Application Priority Data

Feb. 26, 2013   (KR) .................. 10-2013-0020632

(51) Int. Cl.
| | | |
|---|---|---|
| H01L 23/00 | (2006.01) | |
| H01L 21/768 | (2006.01) | |
| H01L 23/31 | (2006.01) | |
| H01L 21/48 | (2006.01) | |
| H01L 21/56 | (2006.01) | |

(Continued)

(52) U.S. Cl.
CPC .............. *H01L 24/95* (2013.01); *H01L 21/486* (2013.01); *H01L 21/56* (2013.01); *H01L 21/76897* (2013.01); *H01L 21/76898* (2013.01); *H01L 21/78* (2013.01); *H01L 23/3128* (2013.01); *H01L 23/3135* (2013.01); *H01L 23/49827* (2013.01); *H01L 24/11* (2013.01); *H01L 24/81* (2013.01); *H01L 24/94* (2013.01); *H01L 24/97* (2013.01); *H01L 25/50* (2013.01); *H01L 2224/1182* (2013.01); *H01L 2224/13024* (2013.01); *H01L 2224/16145* (2013.01); *H01L 2224/16225* (2013.01); *H01L 2224/16235* (2013.01); *H01L 2224/32145* (2013.01); *H01L 2224/32225* (2013.01); *H01L 2224/73204* (2013.01); *H01L 2224/94* (2013.01); *H01L 2224/97* (2013.01); *H01L 2924/12042* (2013.01); *H01L 2924/15311* (2013.01); *H01L 2924/18161* (2013.01)

(58) Field of Classification Search
CPC .......................... H01L 23/481; H01L 24/95
See application file for complete search history.

(56) References Cited

U.S. PATENT DOCUMENTS

| | | |
|---|---|---|
| 7,838,337 B2 | 11/2010 | Marimuthu et al. |
| 7,863,092 B1 | 1/2011 | Chaware et al. |

(Continued)

FOREIGN PATENT DOCUMENTS

KR         2012-0091867          8/2012

*Primary Examiner* — Joseph C Nicely
(74) *Attorney, Agent, or Firm* — EIPG, PLLC

(57) ABSTRACT

A method of fabricating a semiconductor package includes providing a wafer which includes an upper area having through silicon vias (TSVs) and a lower area not having the TSVs; mounting a semiconductor chip on the upper area of the wafer; forming a passivation layer to a predetermined thickness to cover the semiconductor chip; exposing the TSVs by removing the lower area of the wafer in a state where no support is attached to the wafer; and exposing a top surface of the semiconductor chip by partially removing the passivation layer.

12 Claims, 12 Drawing Sheets

(51) Int. Cl.
*H01L 23/498* (2006.01)
*H01L 21/78* (2006.01)
*H01L 25/00* (2006.01)

(56) References Cited

U.S. PATENT DOCUMENTS

| | | |
|---|---|---|
| 7,915,080 B2 | 3/2011 | Takahashi et al. |
| 7,960,840 B2 | 6/2011 | Bonifield et al. |
| 8,017,439 B2 | 9/2011 | Takahashi et al. |
| 8,158,456 B2 | 4/2012 | Chen et al. |
| 2010/0244241 A1 | 9/2010 | Marimuthu et al. |
| 2012/0012990 A1 | 1/2012 | Pagaila et al. |
| 2012/0074585 A1 | 3/2012 | Koo et al. |
| 2012/0119346 A1 | 5/2012 | Im et al. |
| 2012/0211885 A1 | 8/2012 | Choi et al. |
| 2012/0256322 A1* | 10/2012 | Itou ................ H01L 21/563 257/778 |

* cited by examiner

1000

METHOD OF FABRICATING SEMICONDUCTOR PACKAGE

CROSS-REFERENCE TO RELATED APPLICATIONS

This application is a Divisional of prior application Ser. No. 13/837,179, filed on Mar. 15, 2013 in the United States Patent and Trademark Office, which claims priority from Korean Patent Application No. 10-2013-0020632 filed on Feb. 26, 2013 in the Korean Intellectual Property Office, the disclosure of which is incorporated herein by reference in its entirety.

BACKGROUND OF THE INVENTION

1. Field of the Invention

The present inventive concept relates to a method of fabricating a semiconductor package.

2. Description of the Related Art

One of the major challenges in the semiconductor industry is to fabricate small, multi-function, high-capacity and highly reliable products at low costs. One of the most important technologies that make it possible to achieve such a complex goal is semiconductor package technology. Of package technologies, a chip-stacked semiconductor package in which a plurality of chips are stacked is being suggested as a way to achieve the above complex goal.

SUMMARY OF THE INVENTION

Features of the present inventive concept provide a method of fabricating a semiconductor package at reduced costs and improved process speed.

Additional features and utilities of the present general inventive concept will be set forth in part in the description which follows and, in part, will be obvious from the description, or may be learned by practice of the general inventive concept.

Exemplary embodiments of the present inventive concept provide a method of fabricating a semiconductor package, the method comprising: providing a wafer which comprises an upper area having through silicon vias (TSVs) and a lower area not having the TSVs; mounting a semiconductor chip on the upper area of the wafer; forming a passivation layer to a predetermined thickness to cover the semiconductor chip; exposing the TSVs by removing the lower area of the wafer in a state where no support is attached to the wafer; and exposing a top surface of the semiconductor chip by partially removing the passivation layer.

Exemplary embodiments of the present inventive concept also provide a method of fabricating a semiconductor package, the method comprising: providing a wafer which comprises an upper area having TSVs and a lower area not having the TSVs; mounting a semiconductor chip on the upper area of the wafer; forming a passivation layer to a predetermined thickness to cover the semiconductor chip; exposing the TSVs by removing the lower area of the wafer in a state where no support is attached to the wafer; forming bottom pads and bump balls, which are electrically connected to the exposed TSVs, on a bottom surface of the wafer; and exposing a top surface of the semiconductor chip by partially removing the passivation layer.

Exemplary embodiments of the present inventive concept also provide a method of fabricating a semiconductor package, the method comprising: providing a wafer which comprises a first area having through silicon vias (TSVs) and a second area not having the TSVs; mounting a semiconductor chip on the first area of the wafer, the semiconductor chip being wider than the wafer to extend beyond sides thereof; forming a passivation layer to a predetermined thickness to cover the wafer and exposed portions of the semiconductor chip extending beyond the wafer; and exposing the TSVs by removing the second area of the wafer and corresponding portion of the passivation layer in a state where no support is attached to the wafer.

In an exemplary embodiment, the method may further include forming through vias in the remaining passivation layer to be electrically connected to power/ground pads of the semiconductor chip when the through vias in the first area are being exposed.

In an exemplary embodiment, the method may further include forming connection terminals to be electrically connected to the exposed TSVs on a bottom surface of the wafer; and forming connection terminals to be electrically connected to the exposed through vias of the passivation layer.

In an exemplary embodiment, the mounting of the semiconductor chip comprises mounting the semiconductor chip in the form of a flip-chip.

In another exemplary embodiment, the wafer may include: top pads which are electrically connected to the semiconductor chip; and a redistribution layer which electrically connects the TSVs and the top pads through redistribution lines included therein.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
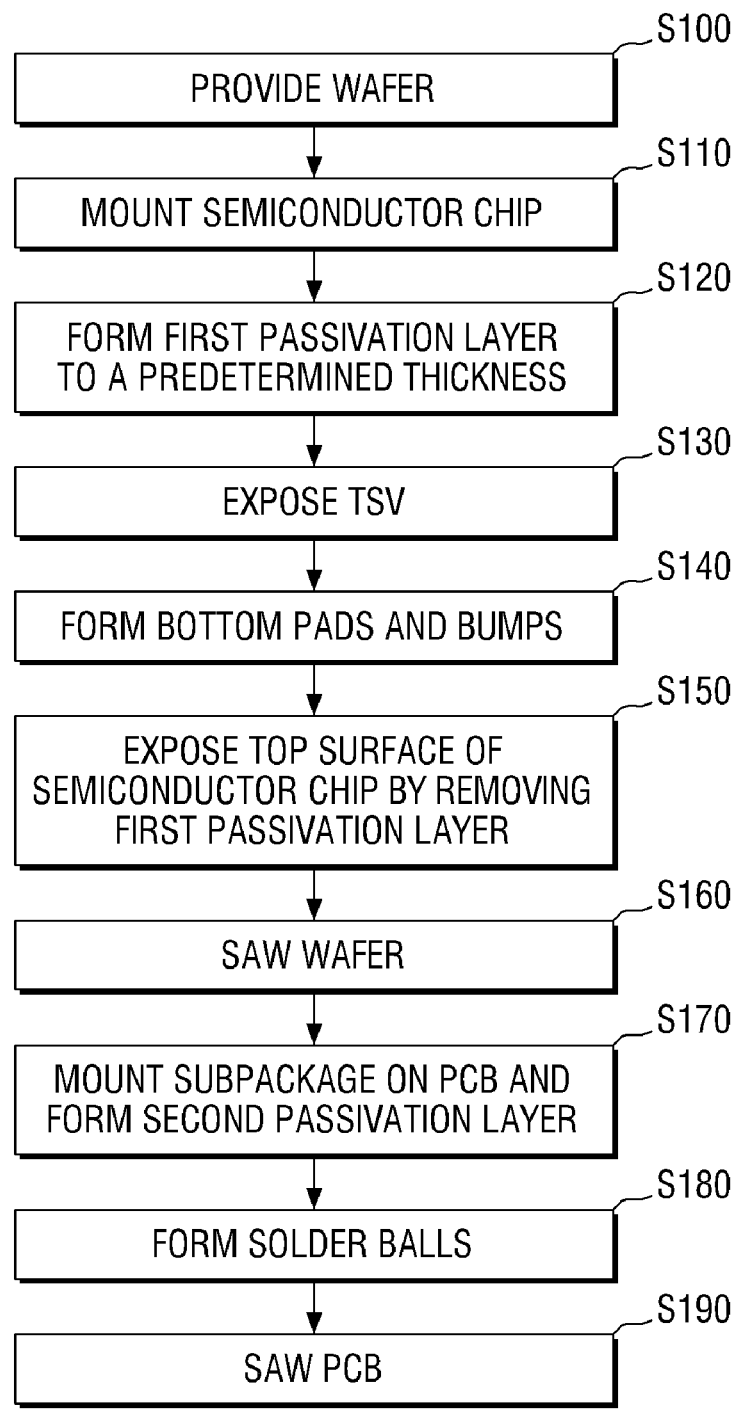
FIG. 1 is a flowchart illustrating a method of fabricating a semiconductor package according to an embodiment of the present inventive concept.

Features and utilities of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 2:
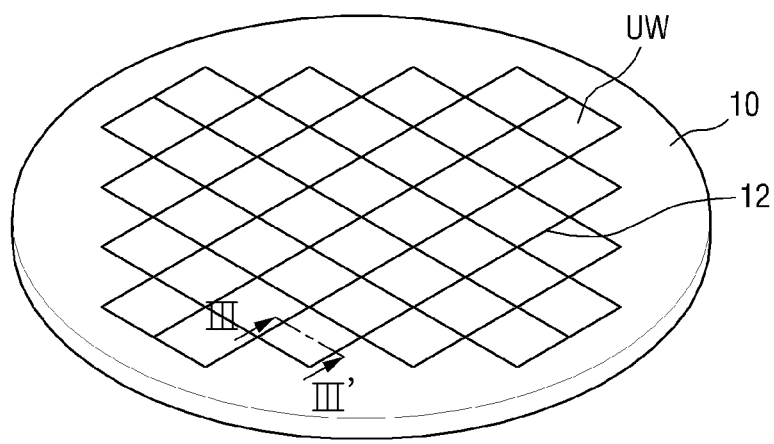
FIGS. 2 through 13 are views illustrating operations of the method of fabricating a semiconductor package according to the embodiment of FIG. 1.
Figure 3:
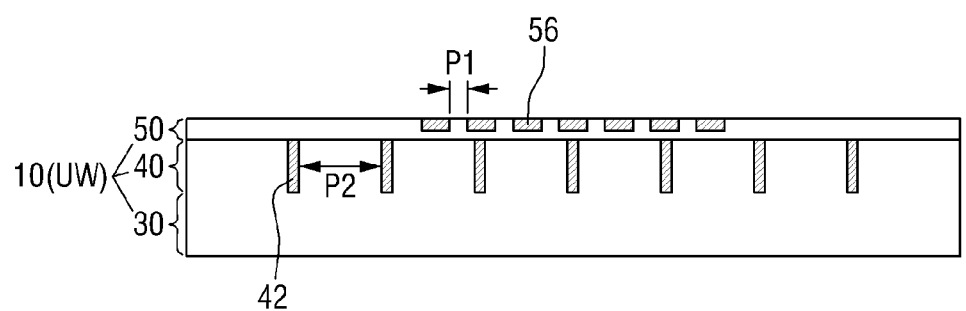
Figure 4:
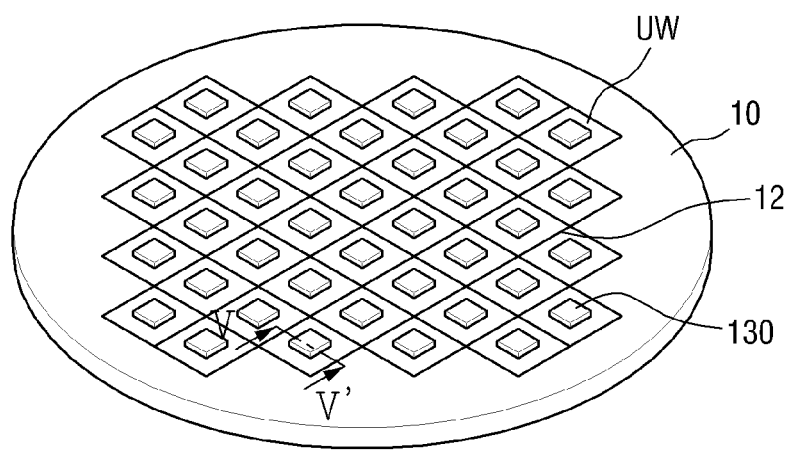
Figure 5:
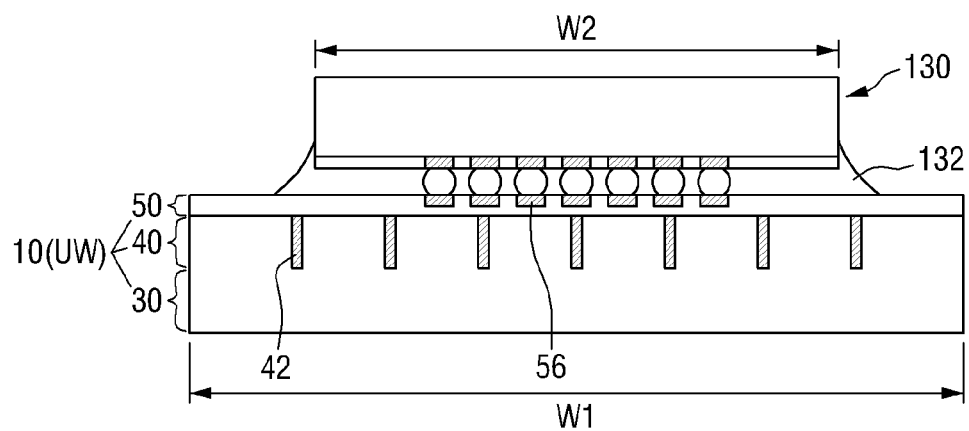
Figure 6:
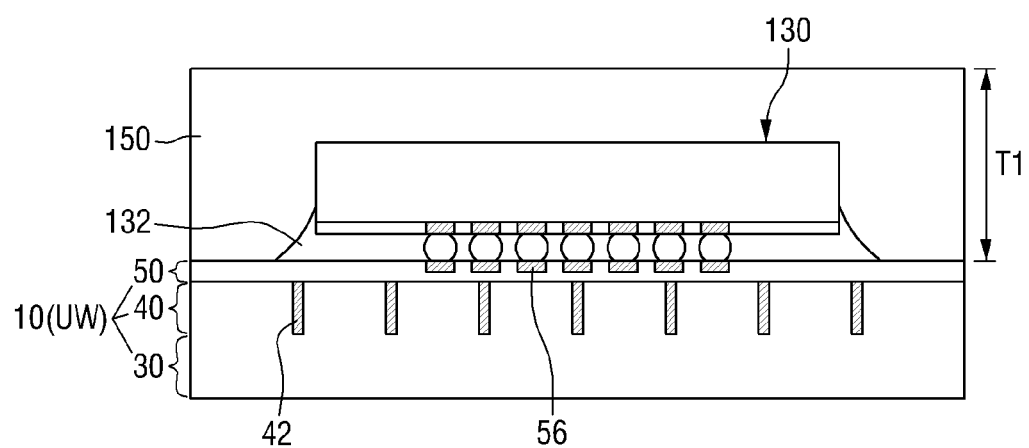
Figure 7:
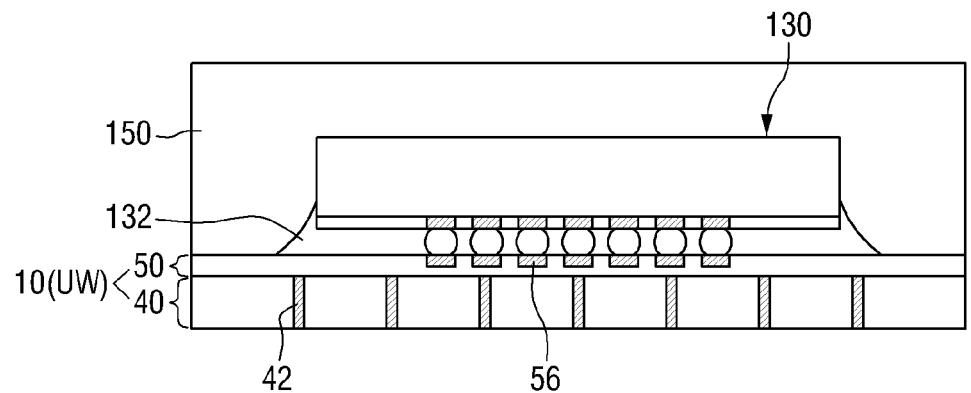
Figure 8:
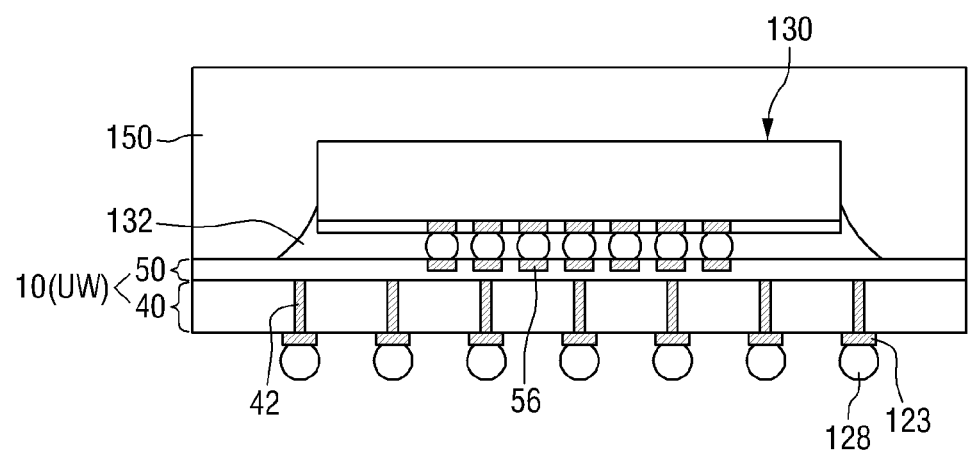
Figure 9:
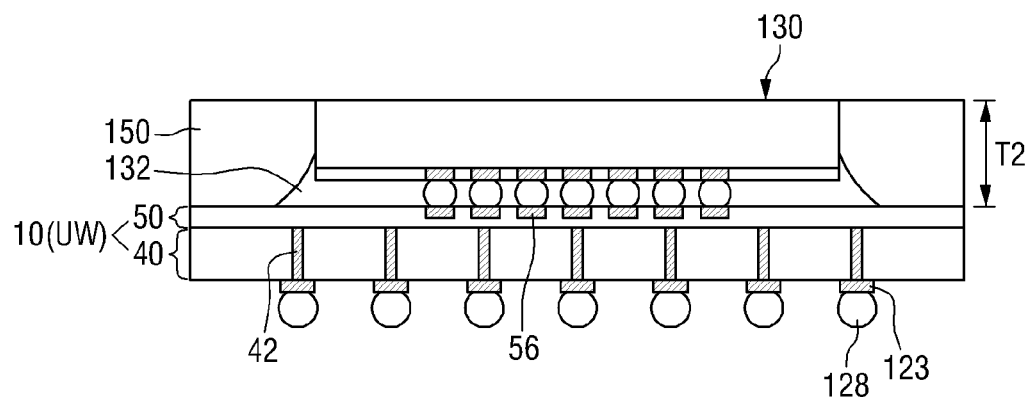
Figure 10:
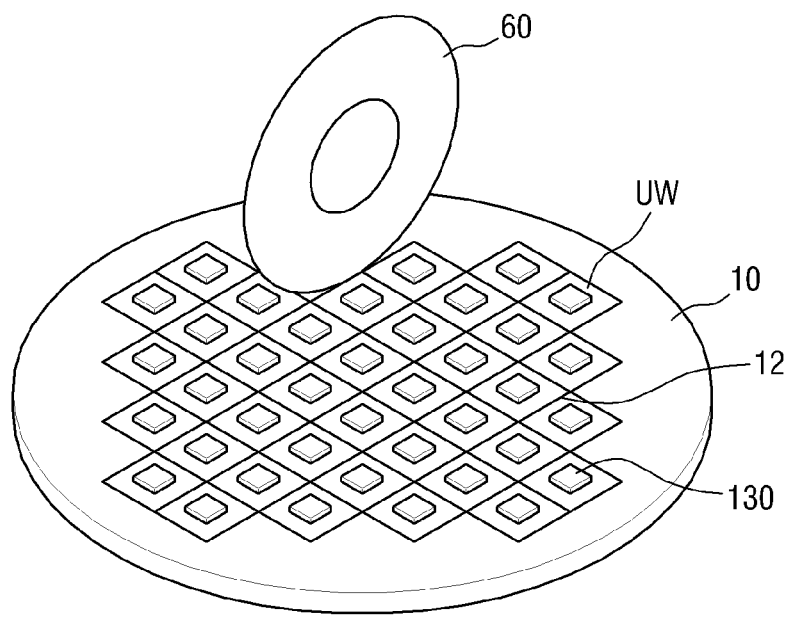

FIG. 1 is a flowchart illustrating a method of fabricating a semiconductor package according to an embodiment of the present inventive concept. FIGS. 2 through 13 are views illustrating operations of the method of fabricating a semiconductor package according to an embodiment of the present inventive concept. Specifically, FIG. 3 is a cross-sectional view taken along line III-III' of FIG. 2, FIG. 5 is a cross-sectional view taken along line V-V' of FIG. 4, and FIG. 12 is a cross-sectional view taken along line XII-XII' of FIG. 11.

Referring to FIG. 1, a wafer is provided (operation S100). Specifically, referring to FIG. 2, a wafer 10 including a plurality of unit wafers UW is provided. The unit wafers UW may be divided by a scribing line 12 and placed on the wafer 10.

Referring to FIG. 3, the wafer 10 (or the unit wafers UW) may include a lower area 30, an upper area 40 disposed on the lower area 30, and a redistribution layer 50 disposed on the upper area 40.

In the current embodiment, the upper area 40 of the wafer 10 may include a plurality of through silicon vias (TSVs) 42, and the lower area 30 of the wafer 10 may not include the TSVs 42.

Each of the TSVs 42 may include an insulating layer, a seed layer, and a conductive layer formed sequentially. The insulating layer may electrically insulate the conductive layer. The insulating layer may include oxide, nitride or oxynitride. Specifically, the insulating layer may include, e.g., silicon oxide, silicon nitride, or silicon oxynitride. The conductive layer may include a conductive material, such as a metal. Examples of the metal that forms the TSVs 42 may include, but is not limited to, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

The insulating layer, the seed layer and the conductive layer that form each of the TSVs 42 may be formed by, but is not limited to, chemical vapor deposition (CVD), plasma enhanced CVD (PECVD), high-density plasma CVD (HDP-CVD), sputtering, metal organic CVD (MOCVD), or atomic layer deposition (ALD).

The lower area 30 and the upper area 40 of the wafer 10 may be formed of a semiconductor material or an insulating material. That is, in some embodiments of the present invention, the lower area 30 and the upper area 40 may include, e.g., silicon, germanium, silicon-germanium, gallium-arsenide (GaAs), glass, ceramic, etc.

The redistribution layer 50 may include a plurality of top pads 56. The top pads 56 may be electrically connected to the TSVs 42 by redistribution lines included in the redistribution layer 50. In some embodiments of the present inventive concept, a first interval P1 between the top pads 56 may be different from a second interval P2 between the TSVs 42. Specifically, the first interval P1 may be smaller than the second interval P2 as shown in the drawing. The top pads 56 and the TSVs 42 arranged at different intervals may be independently and electrically connected to each other by the redistribution lines included in the redistribution layer 50.

The redistribution layer 50 may further include an insulating layer in order for insulation between the redistribution lines included therein. The insulating layer may include oxide, nitride or oxynitride, for example, silicon oxide, silicon nitride or silicon oxynitride.

The redistribution lines may include, for example, a metal. In some embodiments of the present inventive concept, the redistribution lines may be formed of, but is not limited to, the same material as the material that forms the TSVs 42.

Referring back to FIG. 1, a semiconductor chip is mounted on the wafer (operation S110). Specifically, referring to FIGS. 4 and 5, a semiconductor chip 130 is mounted on the upper area 40 of the wafer 10. Here, the semiconductor chip 130 may be mounted on each of the unit wafers UW as shown in FIG. 4.

In some embodiments of the present inventive concept, the semiconductor chip 130 may be mounted on the wafer 10 in the form of a flip-chip. Here, the top pads 56 in the redistribution layer 50 may be electrically connected to the semiconductor chip 130 by, for example, balls formed under the semiconductor chip 130.

In some embodiments of the present inventive concept, the semiconductor chip 130 may be, for example, a logic semiconductor chip or a memory semiconductor chip. The logic semiconductor chip may be a microprocessor, such as a central processing unit (CPU), a controller, or an application specific integrated circuit (ASIC). The memory semiconductor chip may be a volatile memory, such as a dynamic random access memory (DRAM) or a static random access memory (SRAM), or a nonvolatile memory such as a flash memory. In some other embodiments of the present inventive concept, the semiconductor chip 130 may be a semiconductor chip packaged by combining the above-described logic semiconductor chips or memory semiconductor chips. That is, the type of the semiconductor chip 130 according to the current embodiment is not limited to the above examples.

An underfill material 132 may be formed between the semiconductor chip 130 and the wafer 10. The underfill material 132 protects the balls formed under the semiconductor chip 130 and the top pads 56 of the redistribution layer 50 from the outside environment, thereby increasing reliability of electrical connection between the balls formed under the semiconductor chip 130 and the top pads 56 of the redistribution layer 50.

In the current embodiment, the semiconductor chip 130 may be smaller in size than each of the unit wafers UW. That is, a width W2 of the semiconductor chip 130 may be smaller than a width W1 of each of the unit wafers UW.

Referring back to FIG. 1, a first passivation layer is formed to a predetermined thickness (operation S120). Specifically, referring to FIG. 6, a first passivation layer 150 is formed on the wafer 10 to a predetermined first thickness T1. The first thickness T may be a thickness large enough to entirely cover the semiconductor chip 130 and to enable, in a subsequent process, the lower area 30 of the wafer 10 to be removed in a state where no support is attached to the wafer 10.

The semiconductor chip 130 may be completely sealed with the first passivation layer 150. In some embodiments of the present inventive concept, the first passivation layer 150 may include a material different from the above-described underfill material 132. However, the present inventive concept is not limited thereto. In some other embodiments of the present inventive concept, the first passivation layer 150 may include the same material as the above-described underfill material 132.

Referring back to FIG. 1, TSVs placed in an upper area of the wafer are exposed (operation S130). Specifically, referring to FIG. 7, the TSVs 42 placed in the upper area 40 of the wafer 10 are exposed by removing the lower area 30 of the wafer 10. In the current embodiment, the lower area 30 of the wafer 10 is removed in a state where no support is attached to the wafer 10. The lower area 30 of the wafer 10 can be removed in the state where no support is attached to the wafer 10 because the first passivation layer 150 was formed to the first thickness T1 (see FIG. 6) which is large enough to negate the need for a support.

If no support is required in the process of exposing the TSVs 42 by removing the lower area 30 of the wafer 10, glue is not also required to attach a support to the wafer 10. Therefore, costs can be saved in the process of fabricating a semiconductor package 1 (see FIG. 13), and process speed of fabricating a semiconductor package can be improved.

The lower area 30 of the wafer 10 may be removed by, but is not limited to, mechanical polishing, chemical mechanical polishing (CMP), or a separation method, such as smart cut, which separates the lower area 30 from the wafer 10 by forming a weak layer in the wafer 10.

Referring back to FIG. 1, connection terminals including bottom pads and bumps are formed on a bottom surface of the wafer (operation S140). Specifically, referring to FIG. 8, bottom pads 123 electrically connected to the TSVs 42 are formed in regions of a bottom surface of the wafer 10 in which the TSVs 42 are exposed. Then, bumps 128 are formed to be electrically connected to the bottom pads 123. The bumps 128 may be solder balls and may be attached to the bottom pads 123 by a thermocompression bonding process and/or a reflow process.

Referring back to FIG. 1, a top surface of the semiconductor chip is exposed by partially removing the first passivation layer (operation S150). Specifically, referring to FIG. 9, a portion of the first passivation layer 150 disposed on a top surface of the semiconductor chip 130 is removed, thereby exposing the top surface of the semiconductor chip 130.

The first passivation layer 150 may be partially removed by, e.g., CMP. Here, the bottom pads 123 and the bumps 128 formed on the bottom surface of the wafer 10 may be protected with a protective tape. That is, the protective tape may be attached to the bottom pads 123 and the bumps 128 formed on the bottom surface of the wafer 10 in order to protect the bottom pads 123 and the bumps 128. In this state, the first passivation layer 150 may be partially removed by, for example, CMP.

The partial removal of the first passivation layer 150 may result in a reduction in the thickness of the first passivation layer 150 from the first thickness T1 (see FIG. 6) to a second thickness T2.

In some embodiments of the present inventive concept, the upper area 40 of the semiconductor chip 130 may be partially removed in the process of partially removing the first passivation layer 150. As a result, the semiconductor chip 130 may be thinned. In some other embodiments of the present inventive concept, the topmost surface of the semiconductor chip 130 and the topmost surface of the first passivation layer 150 may be made to lie in the same plane by the removal of the first passivation layer 150.

Referring back to FIG. 1, the wafer may be sawed (operation S160). Specifically, referring to FIG. 10, the wafer 10 is sawed along the scribing line 12, thereby separating the unit wafers UW from each other. Each of the unit wafers UW separated from each other may be one sub-package on which the semiconductor chip 130 is mounted. The sawing process may be performed using a cutter 60 as shown in the drawing, or by using a laser.

Referring back to FIG. 1, a sub-package is mounted on a printed circuit board (PCB), and a second passivation layer is formed (operation S170). Specifically, referring to FIGS. 11 and 12, a sub-package obtained by sawing the wafer 10 may be mounted on a PCB 110 such that the bumps 128 of the sub-package are electrically connected to top pads 112 of the PCB 110. The top pads 112 may be electrically connected to bottom pads 114 by distribution lines included in the PCB 110.

A second passivation layer 170 may be formed on the PCB 110 to seal the sub-package. The second passivation layer 170 may be formed to cover the bottom, side, and top surfaces of the sub-package, as shown in the drawings.

The second passivation layer 170 may include an insulating material. In some embodiments of the present inventive concept, the second passivation layer 170 may include a material different from the first passivation layer 150. However, the present inventive concept is not limited thereto. In some other embodiments of the present inventive concept, the second passivation layer 170 may include the same material as the first passivation layer 150.

Figure 11:
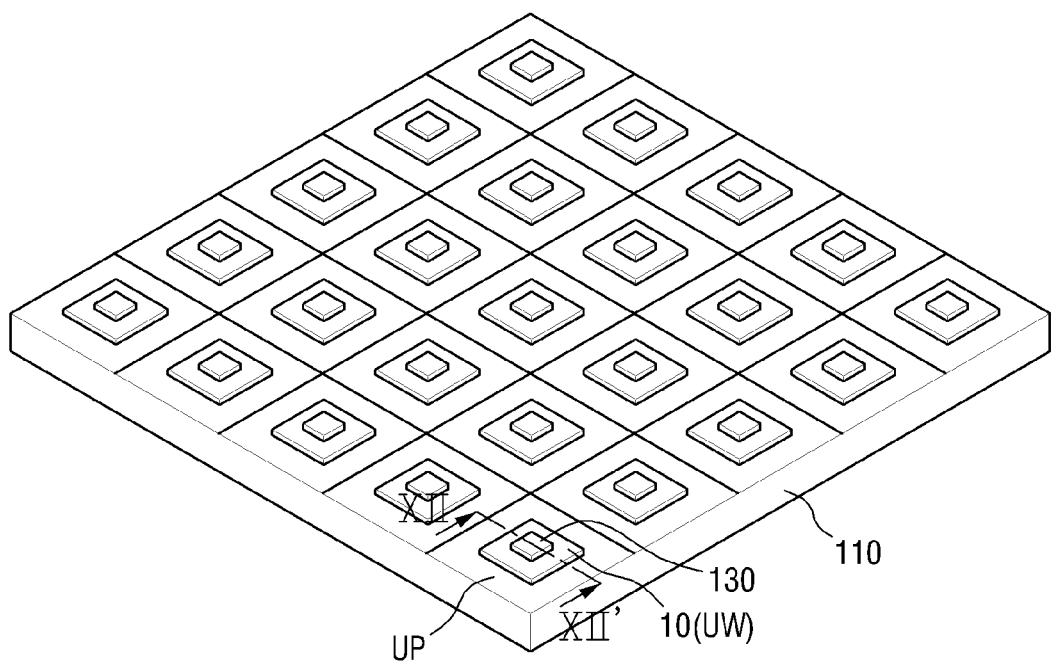
Figure 12:
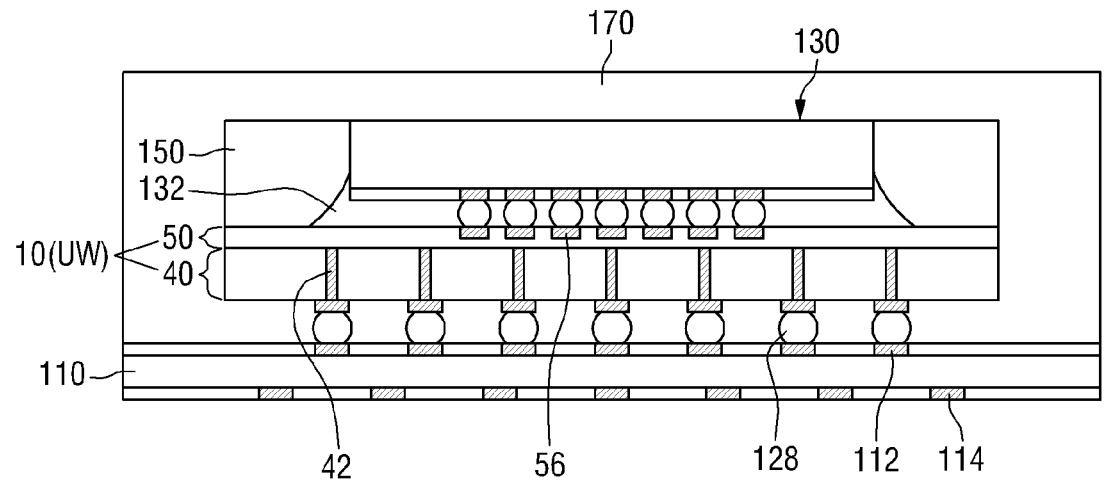

The PCB 110 may include a plurality of unit PCBs UP as shown in FIG. 11, and one sub-package may be mounted on each of the unit PCBs UP. The PCB 110 may be formed by forming a printed circuit of a predetermined shape on a substrate made of glass, ceramic, plastic, etc. However, the present inventive concept is not limited to this example.

Referring back to FIG. 1, solder balls are formed on the PCB (operation S180). Specifically, referring to FIG. 13, solder balls 116 electrically connected to the bottom pads 114 of the PCB 110 may be formed on a bottom surface of the PCB 110. The solder balls 116 may be formed as a grid array such as a pin grid array, a ball grid array or a land grid array.

With the formation of the solder balls 116 on the bottom surface of the PCB 110, the semiconductor chip 130 can be electrically connected to an external device by the top pads 56 included in the redistribution layer 50, the redistribution lines included in the redistribution layer 50, the TSVs 42, the bottom pads 123 formed on the bottom surface of the wafer 10, the bumps 128, the top and bottom pads 112 and 114 of the PCB 110, the solder balls 116, etc.

Figure 13:
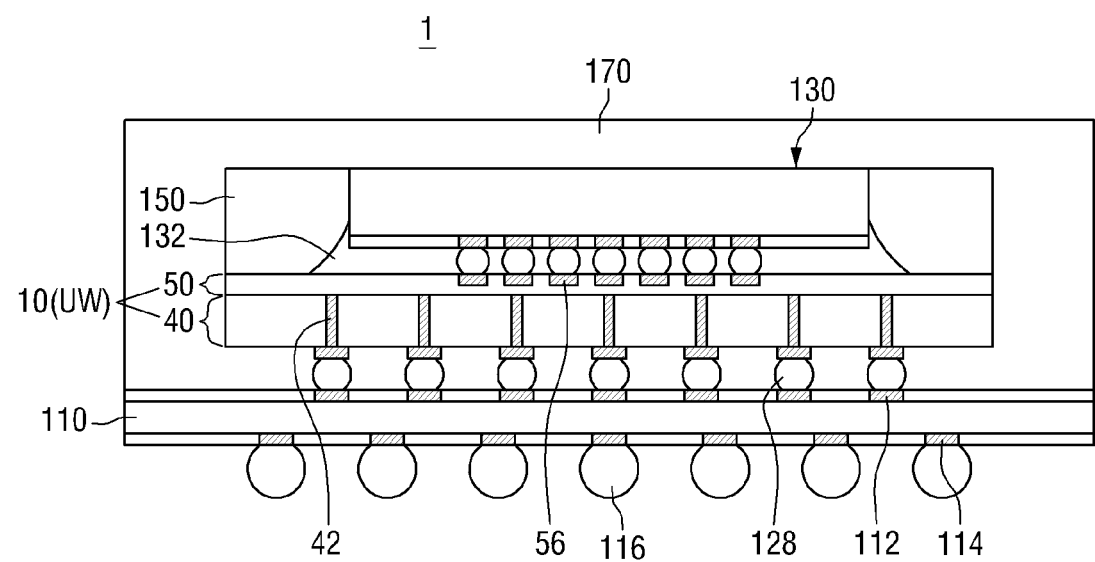

Referring back to FIG. 1, the PCB may be sawed (operation S190). As a result of sawing the PCB 110 into the unit PCBs UP, the semiconductor package 1 as shown in FIG. 13 may be fabricated.

A method of fabricating a semiconductor package according to another embodiment of the present inventive concept will now be described with reference to FIGS. 14 through 16.

Figure 14:
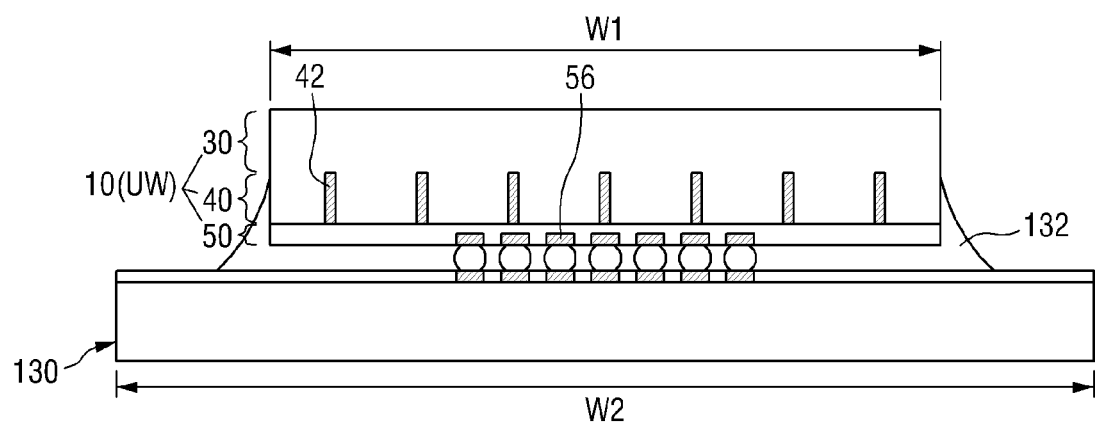
FIGS. 14 through 17 are views illustrating operations of a method of fabricating a semiconductor package according to another embodiment of the present inventive concept.
Figure 15:
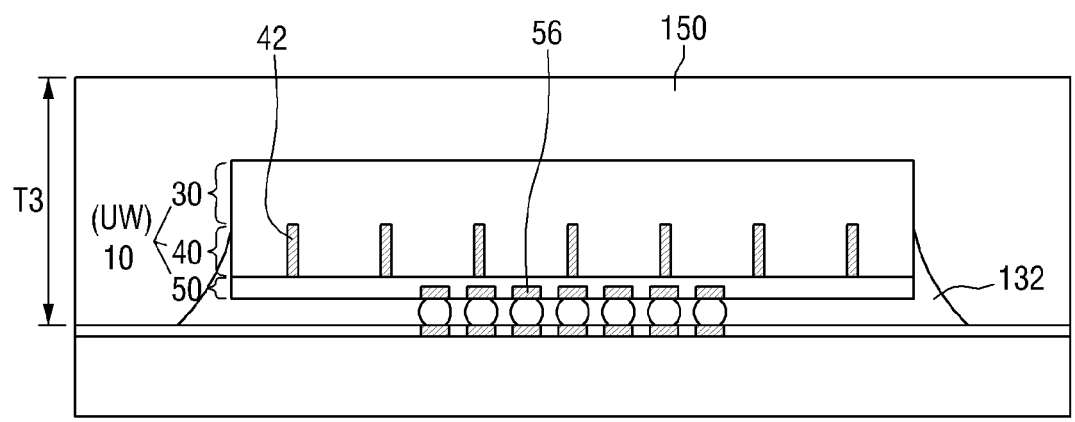
Figure 16:
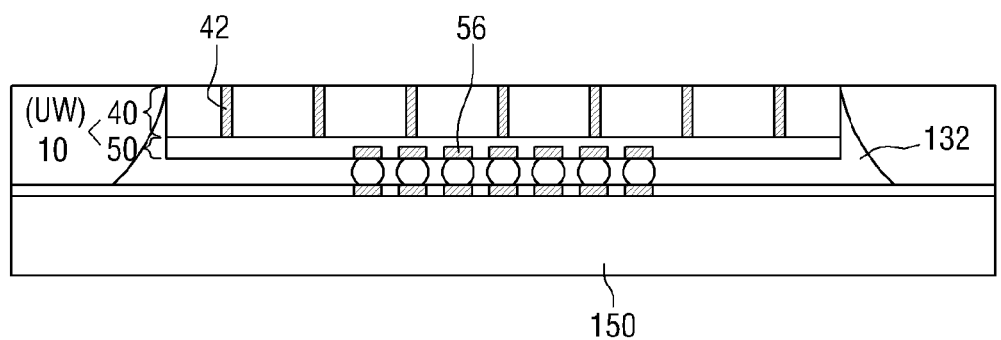

FIGS. 14 through 16 are views illustrating operations of a method of fabricating a semiconductor package according to another embodiment of the present inventive concept. The current embodiment will hereinafter be described, focusing mainly on differences with the pervious embodiment.

Referring to FIG. 14, in the method of fabricating a semiconductor package according to the current embodiment, a semiconductor chip 130 may be larger in size than a unit wafer UW. That is, a width W2 of the semiconductor chip 130 may be greater than a width W1 of the unit wafer UW.

In this case, an underfill material 132 may be formed to a width greater than the width W1 of the unit wafer UW, as shown in the drawing. The underfill material 132 protects balls formed under the semiconductor chip 130 and top pads 56 of a redistribution layer 50 from the outside environment, thereby increasing reliability of electrical connection between the balls formed under the semiconductor chip 130 and the top pads 56 of the redistribution layer 50.

In the current embodiment, the orientation of the unit wafer UW is changed. Accordingly, relative positions of an upper area 40 and a lower area 30 in the previous embodiment are changed. That is, in the current embodiment, the lower area 30 may be placed on the upper area 40.

Referring to FIG. 15, since the semiconductor chip 130 is larger in size than the unit wafer UW in the current embodiment, a first passivation layer 150 may be formed to entirely cover the unit wafer UW. Here, a third thickness T3 of the first passivation layer 150 may be a thickness large enough to enable, in a subsequent process, the lower area 30 of the unit wafer UW to be removed in a state where no support is attached to the unit wafer UW.

Referring to FIG. 16, TSVs 42 placed in the upper area 40 of a wafer 10 are exposed by removing the lower area 30 of the wafer 10. In the current embodiment, the lower area 30 of the wafer 10 is removed in a state where no support is attached to the wafer 10. The lower area 30 of the wafer 10 can be removed in the state where no support is attached to the wafer 10 because the first passivation layer 150 was formed to the third thickness T3 (see FIG. 15) which is large enough to negate the need for a support.

Figure 17:
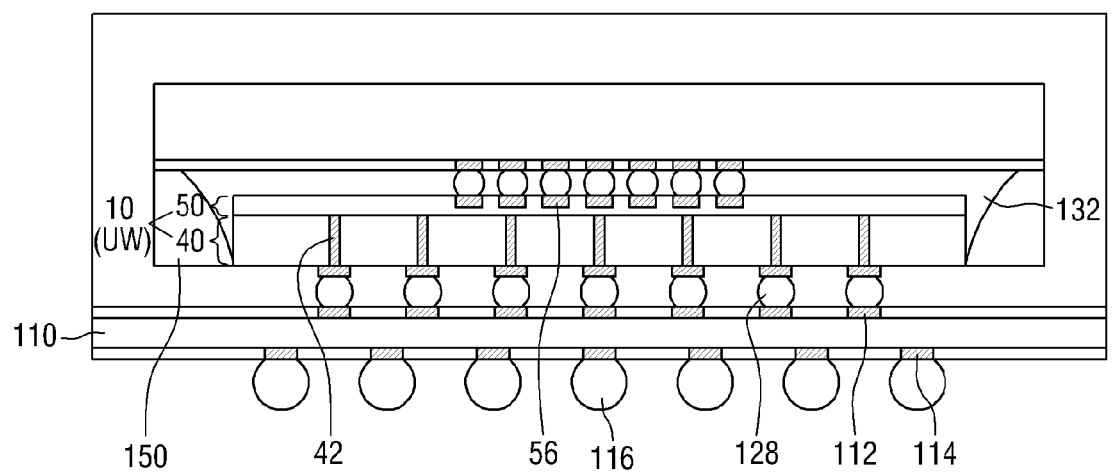

Subsequently, the fabrication process according to the previous embodiment may be performed to produce a semiconductor package 2 as shown in FIG. 17. Here, processes performed can be fully inferred from the previous embodiment by those of ordinary skill in the art to which the present inventive concept pertains, and thus a repetitive description thereof will be omitted.

A method of fabricating a semiconductor package according to another embodiment of the present inventive concept will now be described with reference to FIGS. 18 and 19.

Figure 18:
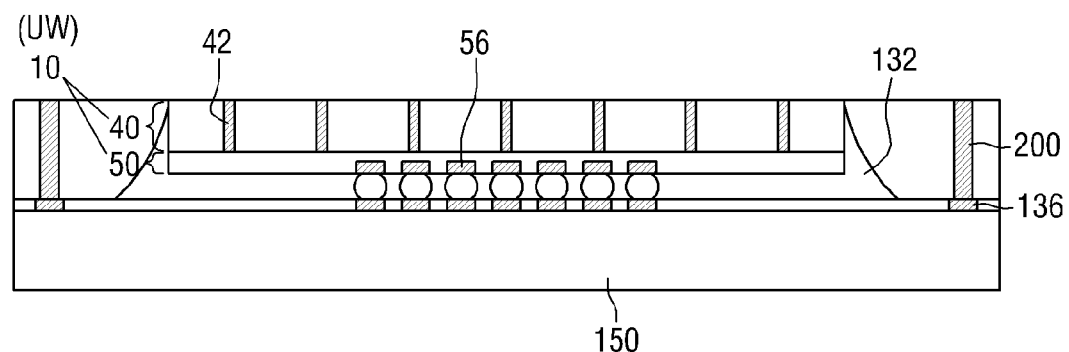
FIGS. 18 and 19 are views illustrating operations of a method of fabricating a semiconductor package according to yet another embodiment of the present inventive concept.
Figure 19:
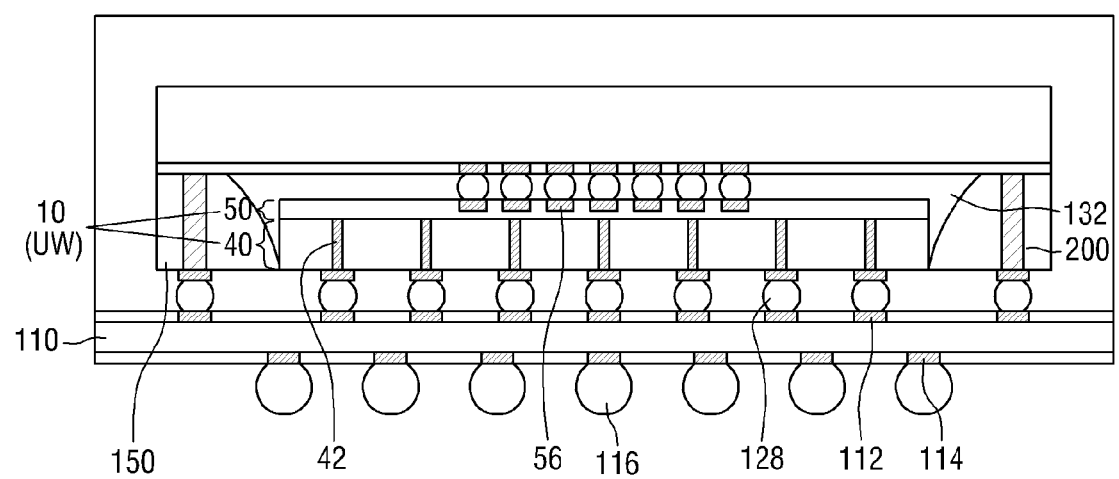

FIGS. 18 and 19 are views illustrating operations of a method of fabricating a semiconductor package according to another embodiment of the present inventive concept. The current embodiment will hereinafter be described, focusing mainly on differences with the previous embodiments.

Referring to FIG. 18, the current embodiment is different from the previous embodiments in that through vias 200 electrically connected to power/ground pads 136 of a semiconductor chip 130 are additionally formed in the current embodiment when TSVs 42 placed in an upper area 40 of a wafer 10 are exposed by removing a lower area 30 of the wafer 10.

While the through vias 200 electrically connected to the power/ground pads 136 of the semiconductor chip 130 are illustrated in FIG. 18, the present inventive concept is not limited thereto. In some embodiments of the present inventive concept, the through vias 200 may be replaced by joint balls.

Subsequently, the fabrication processes according to the previous embodiments may be performed to produce a semiconductor package 3 as shown in FIG. 19. Here, the through vias 200 may be electrically connected to the outside (for example, a power/ground terminal) of the semiconductor package 3 by being electrically connected to, e.g., solder balls 116 as shown in the drawing. Other processes necessary to fabricate the semiconductor package 3 according to the current embodiment can be fully inferred from the previous embodiments by those of ordinary skill in the art to which the present inventive concept pertains, and thus a repetitive description thereof will be omitted.

Figure 20:
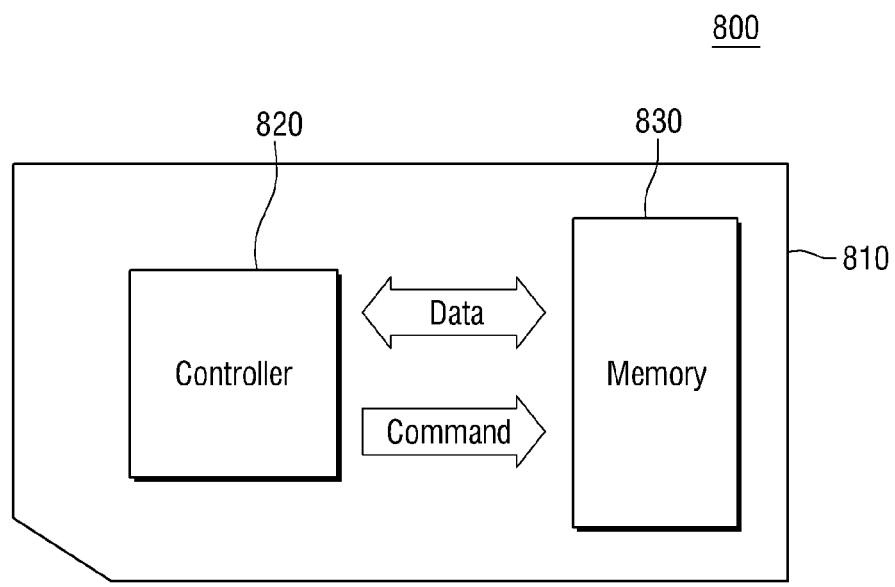
FIG. 20 is a schematic diagram illustrating a memory card to which semiconductor packages according to embodiments of the present inventive concept are applied.

FIG. 20 is a schematic diagram illustrating a memory card 800 to which semiconductor packages according to embodiments of the present inventive concept are applied.

Referring to FIG. 20, the memory card 800 may include a controller 820 and a memory 830 in a housing 810. The controller 820 and the memory 830 may exchange electrical signals. In an example, the memory 830 and the controller 820 may exchange data according to a command of the controller 820. Accordingly, the memory card 800 may store data in the memory 830 or output data from the memory 830.

The controller 820 or the memory 830 may include semiconductor packages according to embodiments of the present inventive concept. In an example, the controller 820 may include a system in package (SIP), and the memory 830 may include a multi-chip package (MCP). The controller 820 and/or the memory 830 may be provided as a stack package (SP).

The memory card 800 may be used as a data storage medium of various portable devices. Examples of the memory card 800 may include a multimedia card (MMC) and a secure digital (SD) card.

Figure 21:
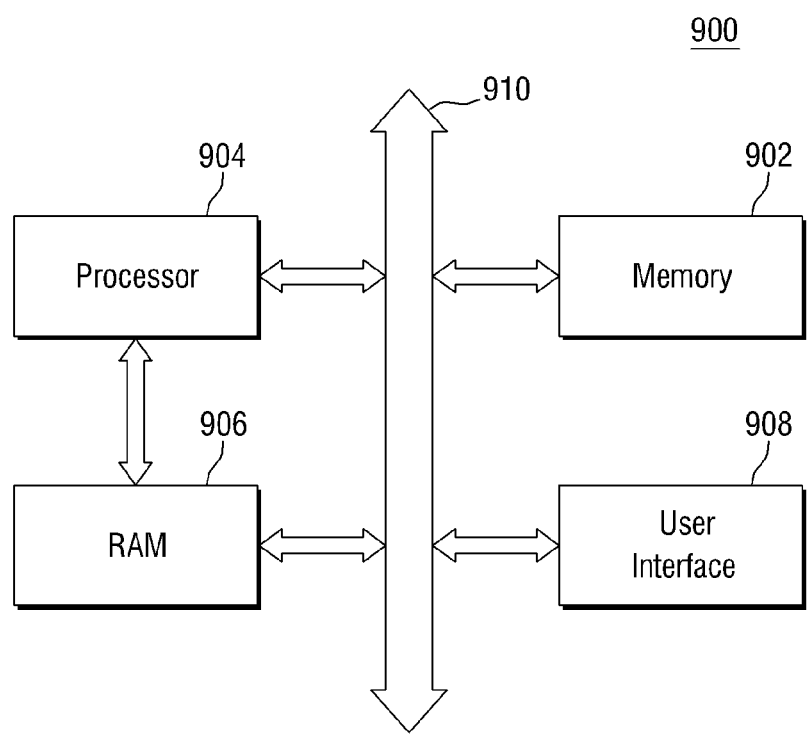
FIG. 21 is a block diagram of an electronic system to which semiconductor packages according to embodiments of the present inventive concept are applied.

FIG. 21 is a block diagram of an electronic system 900 to which semiconductor packages according to embodiments of the present inventive concept are applied.

Referring to FIG. 21, the electronic system 900 may employ the semiconductor packages according to the above-described embodiments of the present inventive concept. Specifically, the electronic system 900 may include a memory system 912, a processor 914, a RAM 916 and a user interface 918.

The memory system 912, the processor 914, the RAM 916 and the user interface 917 may communicate data with each other via a bus 920.

The processor 914 may execute programs, and may control the electronic system 900. The RAM 916 may be used as an operating memory for the processor 914. The processor 914 and the RAM 916 may be packaged into a single semiconductor device or a semiconductor package using the methods of fabricating a semiconductor package according to the above-described embodiments of the present inventive concept.

The user interface 918 may be used to input data to or output data from the electronic system 900.

The memory system 912 may include a controller to drive the memory system 912, and may also include an error correction block. The error correction block may be configured to detect error from data present in the memory system 912 by means of error correction code (ECC) and to correct the detected error.

The memory system 912 may be integrated into a single semiconductor device. The memory system 912 may be integrated into a single semiconductor device so as to form a memory card. In an example, the memory system 912 may be integrated into a single semiconductor device so as to form a memory card such as a PC memory card international association (PCMCIA) card, a compact flash (CF) card, a smart media (SM) card such as SMC), a memory stick, a multimedia card (MMC) (such as RS-MMC or MMCmicro), a secure digital (SD) card (such as miniSD, microSC or SDHC), or a universal flash storage (UFS).

Figure 22:
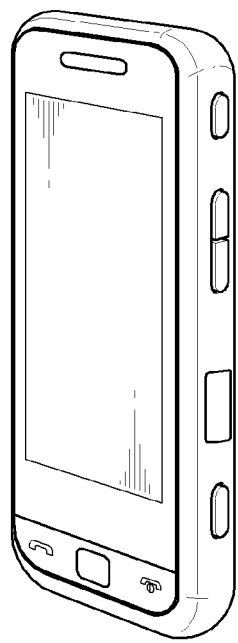
FIG. 22 is a diagram illustrating an example of an application of the electronic system of FIG. 21 to a smartphone.

The electronic system 900 of FIG. 21 may be applied to electronic control devices for various electronic devices. FIG. 22 is a diagram illustrating an example of the application of the electronic system 900 of FIG. 21 to a smartphone 1000. In a case in which the electronic system 900 of FIG. 21 is applied to the smartphone 1000, the electronic system 900 of FIG. 21 may be, but is not limited to, an application processor (AP).

The electronic system 900 of FIG. 21 may be provided as a computer, an Ultra Mobile PC (UMPC), a work station, a net-book computer, a Personal Digital Assistant (PDA), a portable computer, a web tablet, a wireless phone, a mobile phone, a smart phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, a device capable of transmitting and receiving data in a wireless environment, one of a variety of electronic devices that constitute a home network, one of a variety of electronic devices that constitute a computer network, one of a variety of electronic devices that constitute a telematics network, a radio frequency identification (RFID) device, or one of a variety of electronic devices that constitute a computing system.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor package, the method comprising:
   providing a wafer which comprises a first area having through silicon vias (TSVs) and a second area not having the TSVs;
   mounting a semiconductor chip on the first area of the wafer, the semiconductor chip being wider than the wafer to extend beyond sides thereof;
   forming a passivation layer to a predetermined thickness to cover the wafer and exposed portions of the semiconductor chip extending beyond the wafer; and
   exposing the TSVs by removing the second area of the wafer and corresponding portion of the passivation layer in a state where no support is attached to the wafer.

2. The method of claim 1, further comprising:
   forming through vias in the remaining passivation layer to be electrically connected to power/ground pads of the semiconductor chip when the through vias in the first area are being exposed.

3. The method of claim 2, further comprising:
   forming connection terminals to be electrically connected to the exposed TSVs on a bottom surface of the wafer; and
   forming connection terminals to be electrically connected to the exposed through vias of the passivation layer.

4. The method of claim 3, wherein the connection terminals comprise bottom pads and bump balls.

5. The method of claim 3, wherein the connection terminals are protected with a protective tape when the top surface of the semiconductor chip is exposed by partially removing the passivation layer.

6. The method of claim 3, further comprising, after the exposing of the top surface of the semiconductor chip:
   forming sub-packages by sawing the wafer into a plurality of unit wafers; and
   mounting the sub-packages on a printed circuit board (PCB).

7. The method of claim 6, further comprising:
   forming semiconductor packages by sawing the PCB after the mounting of the sub-packages on the PCB.

8. The method of claim 1, wherein the mounting of the semiconductor chip comprises mounting the semiconductor chip in the form of a flip-chip.

9. The method of claim 8, wherein the wafer comprises:
   top pads which are electrically connected to the semiconductor chip; and
   a redistribution layer which electrically connects the TSVs and the top pads through redistribution lines included therein.

10. A method of fabricating a semiconductor package, the method comprising:
    providing a wafer which comprises an upper area having through silicon vias (TSVs) and a lower area not having the TSVs;
    mounting a semiconductor chip on the upper area of the wafer, the semiconductor chip being wider than the wafer to extend beyond sides thereof;
    forming a passivation layer to a predetermined thickness to cover the semiconductor chip;
    exposing the TSVs by removing the lower area of the wafer in a state where no support is attached to the wafer;
    forming bottom pads and bump balls, which are electrically connected to the exposed TSVs, on a bottom surface of the wafer; and
    exposing a top surface of the semiconductor chip by partially removing the passivation layer.

11. The method of claim 10, wherein the wafer further comprises top pads which are arranged at a first interval and a redistribution layer which electrically connects the TSVs and the top pads through redistribution lines included therein, and the TSVs are arranged at a second interval different from the first interval.

12. The method of claim 11, wherein the first interval is smaller than the second interval.

* * * * *